United States Patent
Song et al.

(10) Patent No.: US 7,495,317 B2
(45) Date of Patent: Feb. 24, 2009

(54) SEMICONDUCTOR PACKAGE WITH FERRITE SHIELDING STRUCTURE

(75) Inventors: Eun-Seok Song, Soul (KR); Un-Byoung Kang, Gyeonggi-do (KR); Si-Hoon Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/387,848

(22) Filed: Mar. 24, 2006

(65) Prior Publication Data

US 2007/0023902 A1 Feb. 1, 2007

(30) Foreign Application Priority Data

Aug. 1, 2005 (KR) .................... 10-2005-0070396

(51) Int. Cl.
| | |
|---|---|
| *H01L 23/48* | (2006.01) |
| *H01L 23/52* | (2006.01) |
| *H01L 29/40* | (2006.01) |
| *H04B 3/28* | (2006.01) |
| *H05K 9/00* | (2006.01) |
| *G11B 33/14* | (2006.01) |

(52) U.S. Cl. ............... 257/659; 257/737; 257/738; 257/753; 257/767; 333/12; 361/818; 720/650

(58) Field of Classification Search ............ 257/659, 257/737, 738, 753, 767; 333/12; 361/818; 720/650

See application file for complete search history.

(56) References Cited

U.S. PATENT DOCUMENTS

| | | | |
|---|---|---|---|
| 5,640,047 A | 6/1997 | Nakashima | |
| 6,452,270 B1 * | 9/2002 | Huang | ............ 257/738 |
| 6,492,588 B1 | 12/2002 | Grandy | |
| 6,534,708 B2 | 3/2003 | Ono et al. | |
| 6,686,543 B2 | 2/2004 | Massey | |
| 2002/0180064 A1 * | 12/2002 | Hwan et al. | ............ 257/780 |
| 2003/0218257 A1 * | 11/2003 | Ishio et al. | ............ 257/781 |
| 2005/0263680 A1 * | 12/2005 | Hirano et al. | ............ 257/659 |

FOREIGN PATENT DOCUMENTS

| | | |
|---|---|---|
| DE | 10317596 A1 | 11/2004 |
| JP | 01-206688 | 8/1989 |
| JP | 03-014284 | 1/1991 |
| KR | 1998-026055 | 7/1998 |
| KR | 1020000020191 | 4/2000 |

* cited by examiner

*Primary Examiner*—Callie E Shosho
*Assistant Examiner*—Jonathan C Langman
(74) *Attorney, Agent, or Firm*—Volentine & Whitt, PLLC

(57) ABSTRACT

A semiconductor device comprises at the wafer level one or more ferrite structures adapted to dampen high frequency noise potentially apparent at signal lines and termination points within the semiconductor device. Related methods of forming said ferrite structures are also disclosed.

17 Claims, 15 Drawing Sheets

SEMICONDUCTOR PACKAGE WITH FERRITE SHIELDING STRUCTURE

BACKGROUND OF THE INVENTION

1. Field of the Invention

Embodiments of the invention relate generally to semiconductor devices. More particularly, embodiments of the invention relate to semiconductor devices and related packaging techniques incorporating a ferrite shielding structure.

2. Description of the Related Art

The computational and data manipulation circuitry of semiconductor devices is implemented on dies formed from small portions of a silicon wafer. In and of themselves, semiconductor dies are very small and quite fragile. In their native "cut-from-the-wafer" state, semiconductor dies—while fully functional in their circuitry—are not very useful since their fragile nature prevents practical integration within a host device and their small size precludes practical connections to their internal circuitry. Thus, the need for effective semiconductor packaging techniques arises. The terms "package" or "packaging" in this context refer to any material, process, method, or technique adapted to provide physical protection and/or electrical connection to/from a semiconductor die.

Semiconductor devices, such as microelectronic devices, memory devices, etc., typically encase their constituent semiconductor die in a package or housing in order to provide the die with protection from mechanical shock and the potentially corrosive effects of the surrounding environment. Semiconductor device packages come in a variety of form factors and types, but all functional semiconductor device packages are adapted in provide electrical connection between the semiconductor die and external circuits.

To facilitate connection with external circuits, semiconductor device packages typically provide a plurality of termination points. A "termination point" is any structure adapted to communicate an electrical signal (e.g., power, data, control, address, etc.) from a substrate, or more particularly a signal line or circuit formed on the substrate, to an external point. An "external point" is any electrically conductive structure formed outside the substrate, or more particularly a signal line or circuit formed outside (e.g., off) the substrate. Essentially any three dimensional conductive structure adapted to communicate an electrical signal from a signal line or a circuit formed on a substrate to an external point may serve as a termination point. However, common termination points include; pins, metal leads, and so-called bump structures, for example. As is well understood in the art, a "bump" may be formed in the shape of a ball or a similarly protruding structure from solder or a conductive metal/metal alloy (e.g. gold). Bumps are commonly formed as balls of conductive material formed as a connection means for a semiconductor device. As used hereafter, the term "ball structure" should not be construed as being limited to only spherically shaped conductive structures. Rather, the term ball structure encompasses "bumps" of any reasonable shape and composition.

Within the foregoing context and hereafter, the term "signal line" should be broadly construed to cover any conductive structure adapted to communicate an electrical signal. Metal traces and micro-strip lines commonly formed on and in relation to substrates using conventional layout and patterning techniques are examples of signal lines. Such elements are often formed from conductive materials such as cooper (Cu), aluminum (Al), or gold (Au), or alloys containing similar conductive materials.

Termination points of various types are used in a variety of conventional semiconductor device packaging and fabrication techniques. So-called flip-chip, bump bonding, and multilevel (or stacked) packaging techniques rely on a range of different termination point structures to connect a semiconductor die within a package.

The design issues and fabrication complexities associated with semiconductor device packaging have multiplied over the years as device densities and signal frequencies have increased. High frequency signals (e.g., clock, data, and/or control signals, etc.) have well understood electromagnetic transmission properties. As these electrical signals are increasingly communicated to/from semiconductor devices at frequencies up to and beyond one Gigahertz, various signal transmission problems arise.

For example, the increasingly narrow data switching time periods associated with higher signal frequencies are more susceptible to the adverse effects of electrical interference or noise, and the potential for electromagnetic inference (EMI) rises with the frequency of the signals being communicated to/from the semiconductor device. In one particularly noteworthy phenomenon, densely integrated signal lines and termination points allow high frequency signals to be cross-coupled onto signal lines and/or termination points communicating a power signal. A "power signal" in this context is typical a DC voltage signal, such as ground, $V_{DD}$, $V_{SS}$, $V_{CC}$, etc., intended to power a circuit within the semiconductor device, but a power signal might comprise any relatively low frequency signal. Once coupled onto signal lines or termination points communicating a power signal, the high frequencies signals are communicated throughout the semiconductor device as noise.

This problem has been addressed by several conventional solutions. In one solution, signal lines and termination points are laid out within the semiconductor device such that the possibility for high frequency signal (noise) coupling is minimized. Unfortunately, as semiconductor device densities continue to increase such layout based solutions become increasing difficult to implement. There just isn't enough available surface area on contemporary semiconductor devices to provide adequate separation between signal lines and termination points communicating power signals and those communicating high frequency signals.

In another solution, differential signal lines are used to communicate power signals. As is well understood in the art, differential signals may be used in combination to essentially cancel out high frequency noise components apparent on a signal line communicating a power signal. Unfortunately, the use of differential signal lines doubles the number of power signal lines and associated connection pins in a semiconductor device. As pin counts are rising for many other reasons, and as available surface area in contemporary semiconductor devices comes at increasing premiums, the design costs associated with the use of differential signal lines are increasingly prohibitive.

In still another solution, electromagnetic obstacles are provided to block or eliminate high frequency noise components apparent on a signal line or connection point. Many of these electromagnetic obstacle based solutions are implemented at the package level or higher (e.g., board level) within a system integration comprising the implicated semiconductor device. For example, many System-In-Package (SIP) and Multi-Stack Package (MSP) incorporate some form of electromagnetic obstacle. The discrete decoupling capacitor is one common type of electromagnetic obstacle, but such components tend to be very large in size making their integration into highly dense semiconductor devices difficult.

Example of board level implementations of electromagnetic obstacles may be found, for example, in Japanese Patent Documents JP 1989-206688 filed Feb. 15, 1988, and JP 1991-014284 filed Jun. 13, 1989. In the first Japanese disclosure, a magnetic (ferrite) bead is provided as part of an integrated circuit spacer adapted to facilitate connection between the (outer) lead of a semiconductor package and a printed circuit board (PCB). In the second Japanese disclosure, ferrite beads are arranged around a PCB through via.

Indeed many different noise absorbing, high loss magnetic materials have previously been used in a variety of applications to reduce or eliminate high frequency noise components from an electrical path intended to communicate a signal. The cable industry has faced the problem shielding transmission lines from EMI for many years. U.S. Pat. No. 6,534,708, for example, describes a high loss magnetic material formed from a M-X-Y magnetic composition, where M is a metallic magnetic material consisting of iron (Fe), cobalt (Co), and/or nickel (Ni), X is one or more elements other than M and Y, and Y is fluorine (F), nitrogen (N), and/or oxygen (O). This material is used to clad a signal transmission cable adapted to effectively communicate a power signal in the proximity of high frequency signals.

U.S. Pat. No. 6,492,588 proposes the use of a ferrite-filed polymer and a ferrite bead within a detonation cable. The ferrite structures within the cable act as electromagnetic obstacles and tend to suppress the high frequency noise otherwise coupled onto the conducting portion of the cable.

Similarly, an actuating cable in an airbag system is shielded by the inclusion of graphite material surrounding the signal conductive portion of the cable in U.S. Pat. No. 6,686,543. The subject matter of these patents is hereby incorporated by reference.

Unfortunately, the size and application techniques associated with conventional cabling solutions and board level solution to the reduction of EMI do not suggest a solution to the problem of package level or lower EMI suppression. What is needed is a solution that does not increase signal line or pin counts in a semiconductor device, unlike the use of differential signal lines. What is needed is a solution that does not materially add to the already extreme pressures being placed on signal line and termination point layout criteria in a semiconductor device, unlike discrete electromagnetic obstacles such as decoupling capacitors. What is needed is a solution that is susceptible to implementation at a wafer level or wafer level packaging scale, unlike conventional PCB and cabling based solutions.

SUMMARY OF THE INVENTION

Embodiments of the invention provide a semiconductor device package incorporating an effective electromagnetic obstacle associated with a signal line or termination point communicating a power signal. More particularly, embodiments of the invention are susceptible to implementation at the wafer level (e.g., wafer level packaging) of a fabrication process adapted to produce a semiconductor device. The term "wafer level" generally refers to any process or fabrication technique adapted for use before individual semiconductor dies are cut from a wafer. That is, embodiments of the invention are integral to the design and wafer level fabrication of the semiconductor device itself, rather than being associated with outside the device remedial add-ons, package-to-package connections, or solutions implemented at the PCB level.

In one embodiment, the invention provides a semiconductor device, comprising; a conductive pad formed on a substrate, a termination point electrically connected to the pad, and a ferrite structure formed between the conductive pad and the termination point.

In another embodiment, the invention provides a semiconductor device, comprising; a conductive pad formed on a substrate, a termination point electrically connected to the pad, a signal line connecting the conductive pad and the termination point, and a ferrite structure formed between the conductive pad and the termination point.

In some embodiments, a ball structure may be used as part of the termination point.

In yet another embodiment, the invention provides a method of forming a semiconductor device, comprising; forming a conductive pad on a substrate; forming a termination point on the substrate; and forming a ferrite structure between the conductive pad and the termination point.

In still another embodiment, the invention provides a method of forming a semiconductor device, comprising; forming a conductive pad on a substrate, forming a first insulating layer on the substrate to expose at least a portion of the conductive pad, forming a signal line on the first insulating layer and electrically connected to the exposed portion of the conductive pad, forming a second insulating layer on the signal line, forming a contact well through the second insulating layer to expose a portion of the signal line, forming and patterning a ferrite material layer on the second insulating layer to form a ferrite structure proximate the contact well, and forming a termination point in the contact well in electrical contact with the exposed portion of the signal line, such that the ferrite structure is between the termination point and the exposed portion of the signal line.

In still another embodiment, the invention provides a method of forming a semiconductor device, comprising; forming an insulating layer on the substrate, forming a first ferrite material layer on the insulating layer, forming and patterning a first photoresist pattern to form a first opening exposing a first portion of the first ferrite material layer, forming a signal line in the first opening on the first ferrite material layer, patterning the first photoresist pattern to form a second opening larger than the first opening around the signal line and exposing a second portion of the first ferrite material layer, forming a second ferrite material layer in the second opening, such that the combination of the exposed second portion of the first ferrite layer and the second ferrite layer substantially surround the signal line, forming a second photoresist pattern on the second ferrite material layer, and forming a ferrite structure comprising the combination of the exposed second portion of the first ferrite layer and the second ferrite layer substantially surrounding the signal line using the second photoresist pattern as a mask.

BRIEF DESCRIPTION OF THE DRAWINGS

Exemplary embodiments of the invention will be described hereafter with reference to the attached drawings in which like reference numerals refer to like or similar elements. The drawings include.

DESCRIPTION OF THE EXEMPLARY EMBODIMENTS

Figure 1:
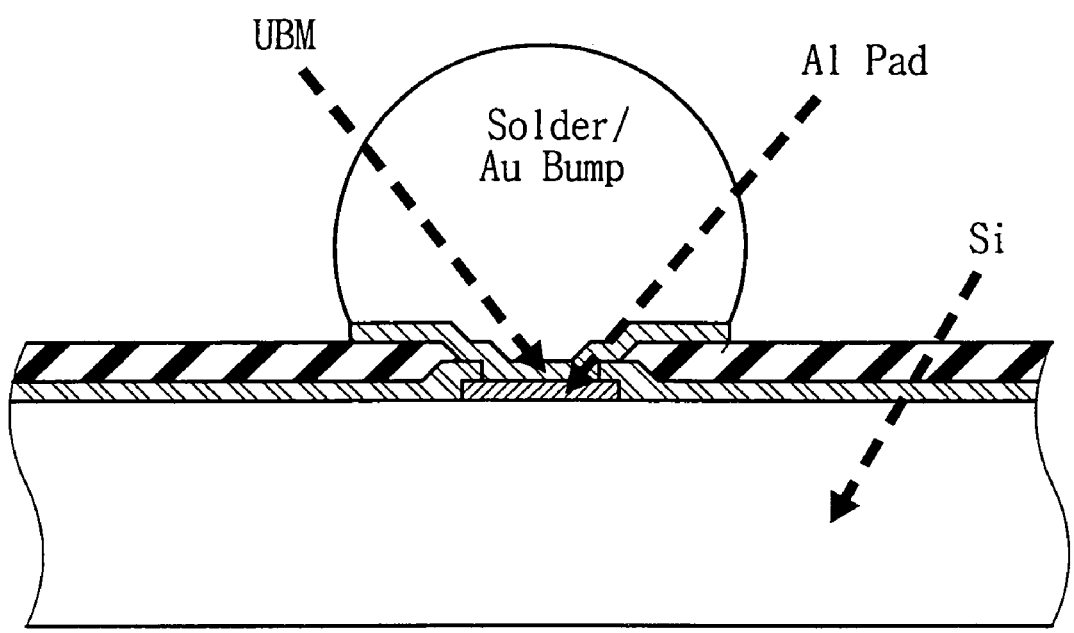
FIG. 1 illustrates a conventional termination point comprising a ball structure.

Selected features and advantages associated with several embodiments of the invention are described hereafter with reference to the accompanying drawings. The invention may, however, be implemented in various embodiments. The nature, construction, and composition of elements in the following embodiments may vary widely with specific design and fabrication technique. Yet, the exemplary embodiments are presented as examples teaching of the making and use of the invention. The scope of the invention should not be construed as being limited to only the teaching examples. Rather, the attached claims define the scope of the invention.

Embodiments of the invention may be directly related to signal lines communicating power signal across (or to/from) the substrate of a semiconductor device. Other embodiments of the invention may be directly related to termination points communicating a power signal to/from the semiconductor device. Examples of both these general solution types will be described below in some additional detail.

In various embodiments, the invention makes use of a ferrite structure to significantly reduce or eliminate high frequency noise from a signal line or termination point communicating a power signal. A "ferrite structure" within this context comprises any composition of oxidized ferrum, and at least one metal including, for example, nickel (Ni), zinc (Zn), manganese (Mn), cobalt (Co), magnesium (Mg), aluminum (Al), barium (Ba), copper (Cu), iron (Fe), etc., and/or any metal alloy containing same. The ferrite structure, however formed, will exhibit a magnetic response to high frequency electrical signals passing in proximity.

One embodiment illustrating the incorporation of a ferrite structure into a semiconductor device will now be described in relation to an exemplary termination point incorporating a bump structure (e.g., a ball structure). The bump may be formed, as is conventional, from solder or a conductive metal such as gold. Other conventional termination points may be similarly modified to incorporate a ferrite structure according to the dictates of the present invention.

However, before describing an embodiment of the invention, it is informative to review the form and nature of an exemplary, conventional termination point. Figure (FIG.) 1 illustrates a conventional termination point formed using a bump. The bump comprises a solder or gold ball structure seated on an Under Bump Metal (UBM) layer. The UBM layer contacts an electrically conductive pad formed from aluminum (Al), for example. The conductive pad is formed on the surface of a substrate within an interlayer dielectric (ILD) layer covering the substrate. The substrate is typically formed from a silicon wafer, but other materials—semi-conducting and non-semi-conducting—might be used. The term "seated" in this context broadly means any fixed positional connection between the bump and an underlying conductive element, such as the UBM layer, sufficient to provide stable electrical contact.

As is understood by those of ordinary skill in the art, the UBM layer is optional to the formation of the conventional termination point. That is, the ball structure might be directly formed on the underlying conductive pad (or alternatively on a conductive signal line exposed through the ILD layer. However, this can be difficult to do in the absence of a UBM layer. That is, the UBM layer may be selectively formed from material(s), or an alloy including material(s). such as; titanium (Ti), tungsten (W), nickel (Ni), tantalum (Ta), chromium (Cr), gold (Au), etc., that provide better adhesive properties in relation to the material used to form the ball structure. Indeed, the UBM layer may serve as a seed layer of sorts facilitating an electroplating process adapted to form the ball structure.

Complex UBM layers may be used with good effect. For example in one embodiment, a UBM layer may comprise a first layer formed from Ti, TiN, or Cr or a related alloy, and a second layer formed from Cu, Au, Ni, or TiN or a related alloy. The first layer is formed in contact with the conductive pad or signal line, and the second layer is formed on the first layer such that it may receive the ball structure. In this manner, the UBM layer may serve as a highly effective electrical contact between elements of disparate material composition.

Thus, given the versatility and positive performance attributes provided by the UBM layer, many termination points will incorporate a UBM layer of some sort. A UBM layer will therefore be considered any metal, metal alloy, and/or conductive material based structure provided to improve formation, adhesion, contact, and/or electrical connection between a bump (e.g., a ball structure) and another structural element (e.g., a conductive pad or signal line).

Figure 2:
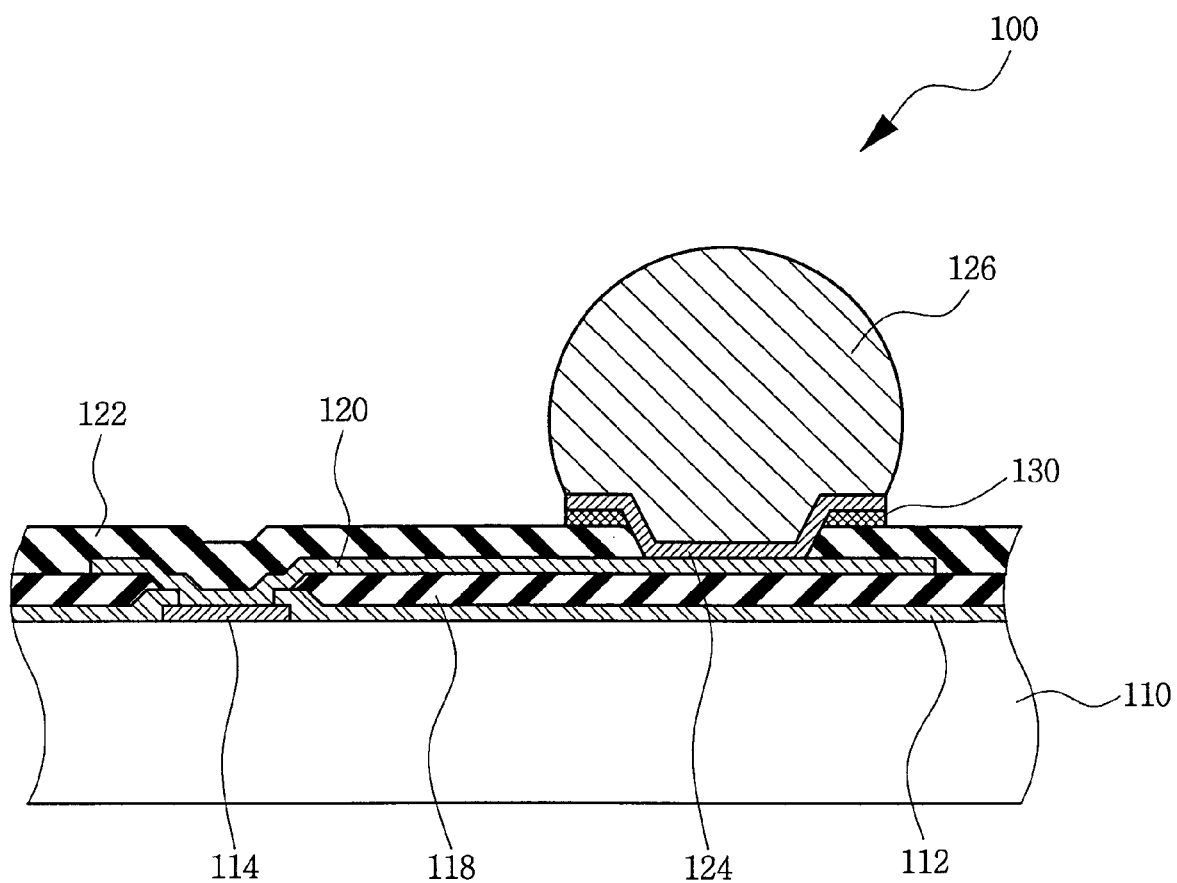
FIG. 2 illustrates one device embodiment of the invention comprising a ferrite structure.

With this background in mind, one embodiment of the invention is illustrated in FIG. 2. FIG. 2 illustrates one example of a wafer level structural solution to the problem of high frequency noise being coupled onto and thereafter transmitted by signal lines or termination points adapted to communicate power signals. The exemplary termination point 100 shown in FIG. 2 comprises a conductive pad 114 formed on a substrate 110. Conductive pad 114 may be variously connected to signal line(s), conductive via(s), and/or conductive regions formed in substrate 110, (not shown), etc. An insulating layer 112 formed from an oxide, for example, may be applied to substrate 110 following formation of conductive pad 114, provided the insulting layer is patterned to expose at some portion of conductive pad 114. A first insulating (e.g., a dielectric) layer 118 may then be formed and patterned on insulating layer 112, such that at least a portion of conductive pad 114 is exposed for electrical connection. (The phrase "formed and patterned" used throughout this description should not be read as necessarily requiring two or more distinct fabrication processes. Rather, those of ordinary skill in the art will appreciate that many different conventional techniques and processes may be used to form the material layer (s) described herein and pattern the material layer(s) into useful geometries).

In the example illustrated in FIG. 2, a redistribution line 120 is connected to conductive pad 114. Alternatively, a signal line formed horizontally across the substrate and/or a conductive via formed vertically through the substrate might be connected to conductive pad 114. However, redistribution lines are commonly used to connect conductive pads and termination points located at different positions on substrate 110. For example, adjacent ball structures may require more separation than adjacent conductive pads due to their disparate size. Thus, redistribution line 120 will serve as an example of the many different types of signals lines that may be incorporated within embodiments of the invention.

Redistribution line 120 is exposed through an overlaying second insulating layer 122 and connected to a UBM layer 124. A ball structure 126 (e.g., a solder ball) is seated on UBM layer 124. However, unlike the conventional termination point structure previously described, the illustrated embodiment comprises a ferrite structure 130 formed at least partially between ball structure 126 and conductive pad 114. The term "between" in this regard denotes at least some physical disposition of the ferrite structure relative to ball structure 126 and conductive pad 114, such that a signal originating at conductive pad 114 and intended to be communicated through ball structure 126 to an external circuit must pass through (or proximate) ferrite structure 130. This relationship also holds for signals passing in the reverse direction from ball structure 126 to conductive pad 114.

Figure 3:
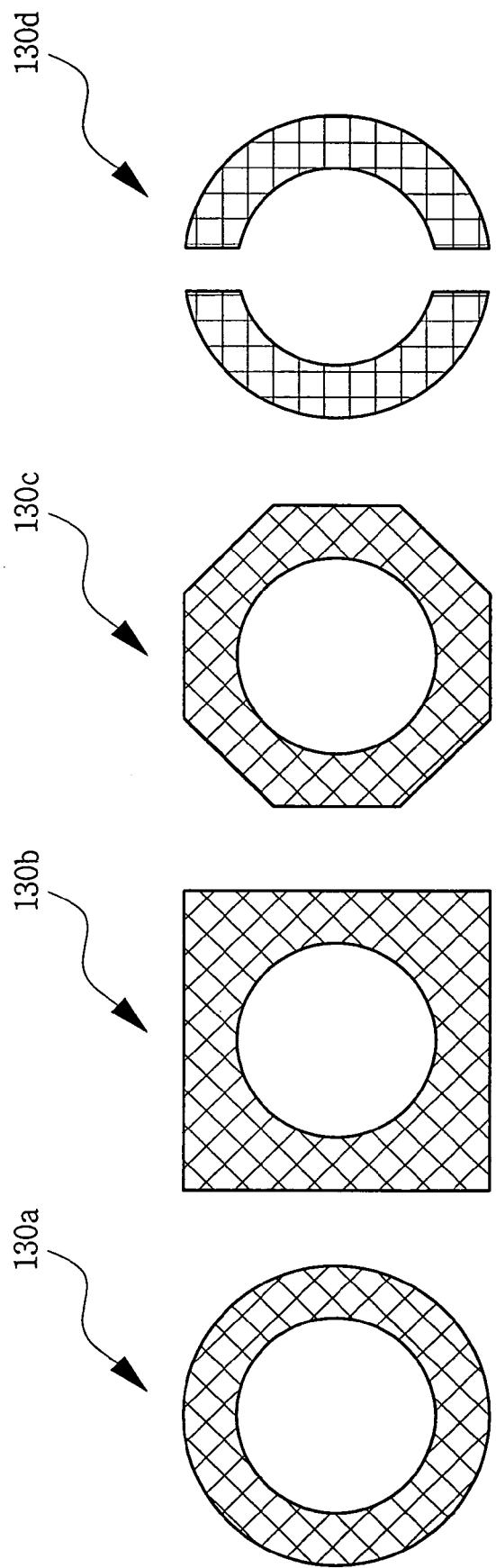
FIG. 3 variously illustrates exemplary shapes for the ferrite structure.

In the illustrated example of FIG. 2, ferrite structure 130 is formed as a collar shaped structure surrounding a lower portion of ball structure 126 as it is seated in contact with UBM layer 124. The collar shaped ferrite structure 130 may be formed with any reasonable geometry. FIG. 3 variously illustrates an elliptical collar shaped ferrite structure 130*a*, a square collar shaped ferrite structure 130*b*, a octagonal collar shaped ferrite structure 130*c*, and a semicircular collar shaped ferrite structure 130*d*. The elliptical nature of the center of each of these exemplary ferrite structures is predicated upon an assumption that the shape of ball structure 126, the shape of underlying UBM layer 124, and/or the shape of a contact well 117 (see, FIGS. 5A-5F) formed through the second insulating layer 122 to expose redistribution line 120 suggest a corresponding ferrite structure having an elliptical center. If, however, a rectangular shaped center for ferrite structure 130 were alternately suggested by the nature and shape of one or more of the foregoing elements, a rectangular center could be substituted for exemplary ferrite structures shown in FIG. 3. No matter the geometry of the related termination point elements, the shape of ferrite structure 130 may be designed to allow a snug fit around or proximate to the electrically conductive path for the power signal of interest.

This design principal follows from a recognition that ferrite structure 130 serves to dampen high frequency signals passing closely through (or proximate to) it. That is, the material from which ferrite structure 130 is formed is magnetically responsive to an electrical signal passing in close proximity. The magnetic field generated by ferrite structure 130 in response to passing high frequency signals acts in opposition to the phase changes of the high frequency signals, thereby tending to diminish the signals' amplitude (i.e., strength). Accordingly, ferrite structure 130 should be designed and positioned within embodiments of the invention such that as much of its mass as possible comes into close proximity (and preferably close surrounding proximity) to the passing electrical signal. Naturally, the practical design choices for the size, shape, and location of ferrite structure 130 will be determined to a large extent by the overall design of the semiconductor device, including the design of its constituent termination points, and/or the allowable layout area for the connecting signal lines.

Figure 4:
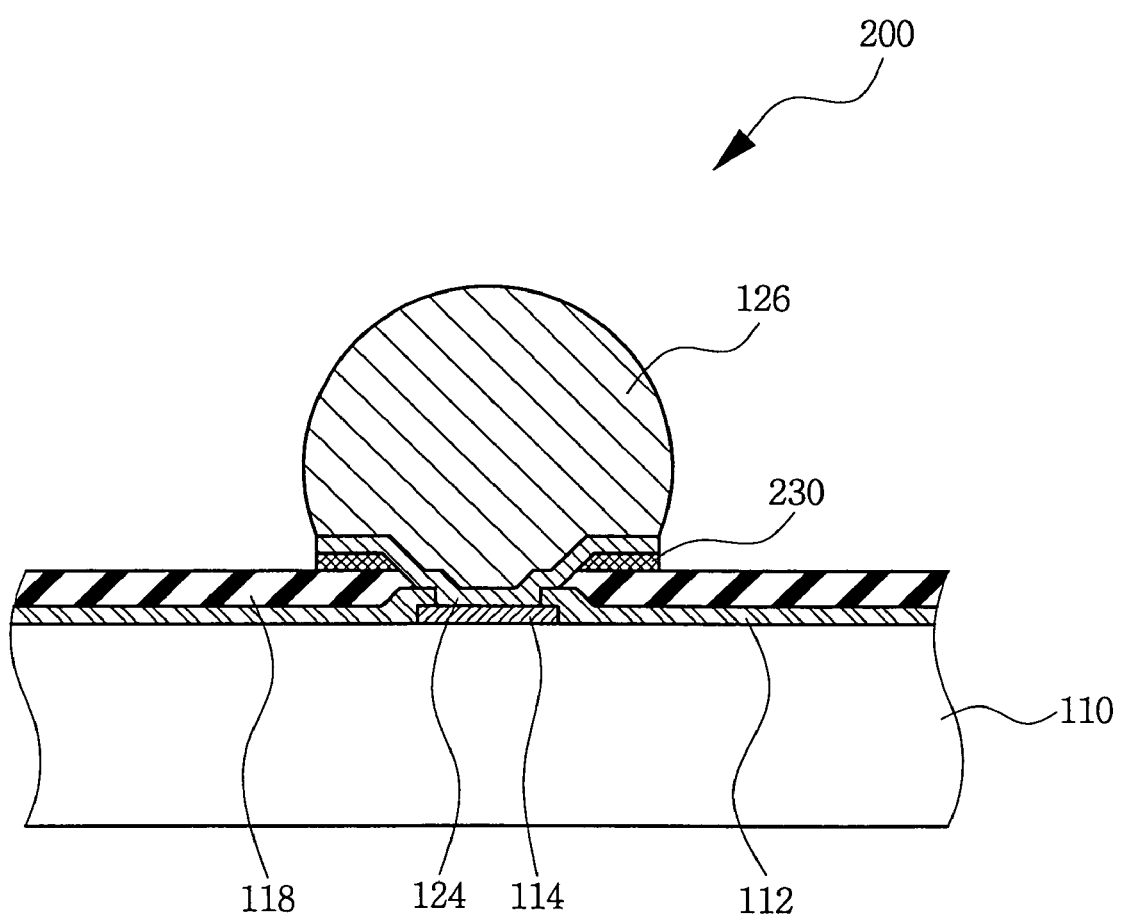
FIG. 4 illustrates another device embodiment of the invention comprising a ferrite structure.

FIG. 4 illustrates another embodiment on the invention drawn to another exemplary termination point 200. In contrast with the embodiment shown in FIG. 2, the ball structure 126 of FIG. 4 is formed directly on (i.e., vertically aligned with) conductive pad 114. Here again, an intervening UBM layer 124 is used to improve the electrical contact between ball structure 126 and conductive pad 114. However, as described with respect to FIG. 2, a ferrite structure 230 of defined shape and size is arranged between ball structure 126 and conductive pad 114.

Figure 5A:
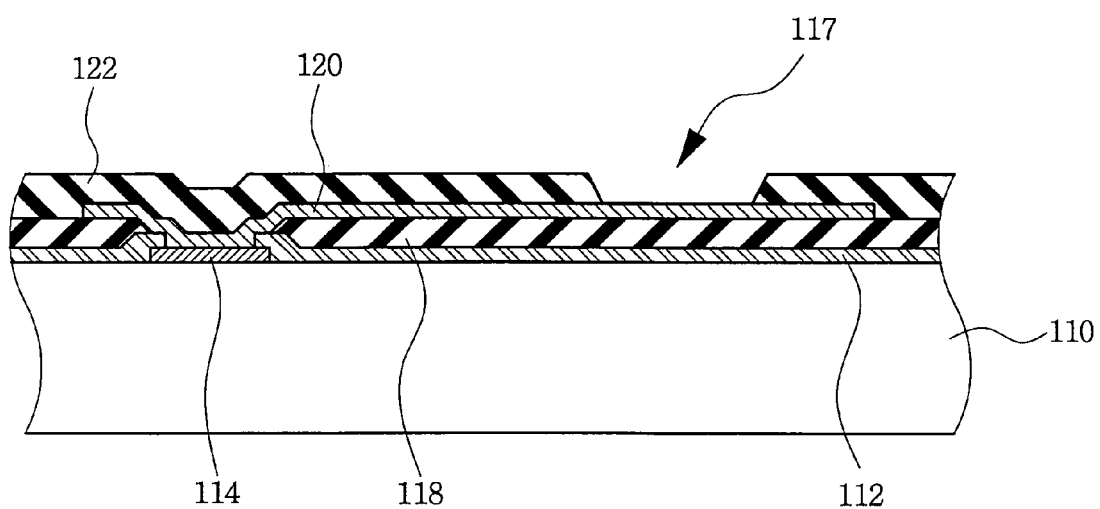
FIGS. 5A through 5F variously illustrate several method embodiments of the invention.

FIGS. 5A through 5F variously illustrate different processes adapted to form a ferrite structure in relation to a termination point on a semiconductor device. Referring to FIG. 5A, a conventional electroplating or sputtering process may be used to form a conductive pad 114 on a substrate 110. Conductive pad 114 is exposed through an insulating layer 112 which may be formed and patterned from an oxide layer, for example, using conventional processes. Although not shown for the sake of clarity, conductive pad 114 may be variously connected to a (substantially) horizontally disposes signal line, a (substantially) vertically disposed conductive via, and/or an underlying conductive region formed in substrate 110. Indeed, the term "conductive pad" should be broadly construed as covering any conductive point on a wafer level semiconductor device at which an electrical signal may be constantly or intermittently present.

A first insulating layer 118 formed from one or more insulating or passivating materials, such as silicon nitride (SiN) for example, is then formed and patterned on insulting layer 112 to expose at least some portion of conductive pad 114. A redistribution line 120 (e.g., a specific example of the more generic "signal line") is then formed on first insulating layer 118 and in electrical contact with the exposed portion of conductive pad 114. Redistribution line 120 may be formed and patterned from metal or a metal alloy using conventional photolithography and etching processes. Thereafter, a second insulating layer 122 is formed on redistribution line 120 and patterned to form a contact well 117 exposing a desired portion of redistribution line 120. Second insulating layer 122 may be spin coated onto the upper surface of redistribution line 120 and then selectively patterned using conventional photolithography and etching processes. Contact well 117 may take any reasonable shape, so long as it effectively exposes a portion of a signal line or, alternatively, a conductive pad sufficient to enable completion of the termination point.

Figure 5B:
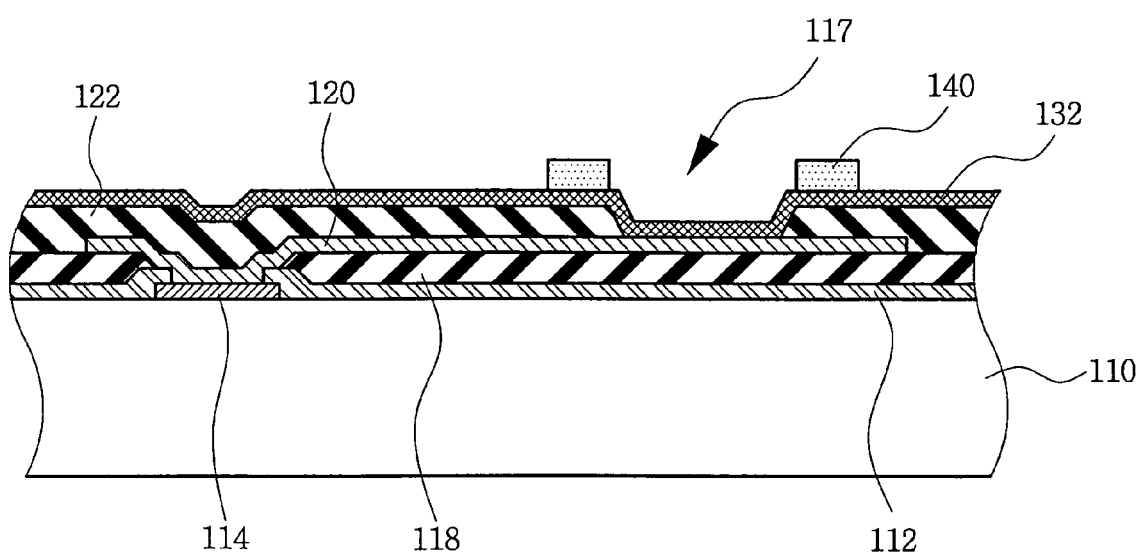

Referring to FIG. 5B, a ferrite layer 132 is then formed on second insulating layer 122 to cover at least the portions of the second insulating layer 122 proximate contact well 117. Ferrite layer 132 may be formed from any material composition comprising; oxidized ferrum and at least one metal, such as nickel (Ni), zinc (Zn), manganese (Mn), cobalt (Co), magnesium (Mg), aluminum (Al), barium (Ba), copper (Cu), iron (Fe), etc., and/or any metal alloy containing same. Ferrite layer 132 may be formed to a desired thickness from a single homogenous material layer, or it may be formed from multiple layers having, potentially, different material compositions, including, for example, material layers adapted to improve mechanical adhesion to and electrical contact with adjacent elements. Ferrite layer 132 may be formed to the desired thickness during a single processing step, or it may be incrementally built up during a number of sequentially applied processing steps. In some embodiments, ferrite layer 132 will be formed to a thickness ranging from between about 1000 Å to 1 um.

Figure 5C:
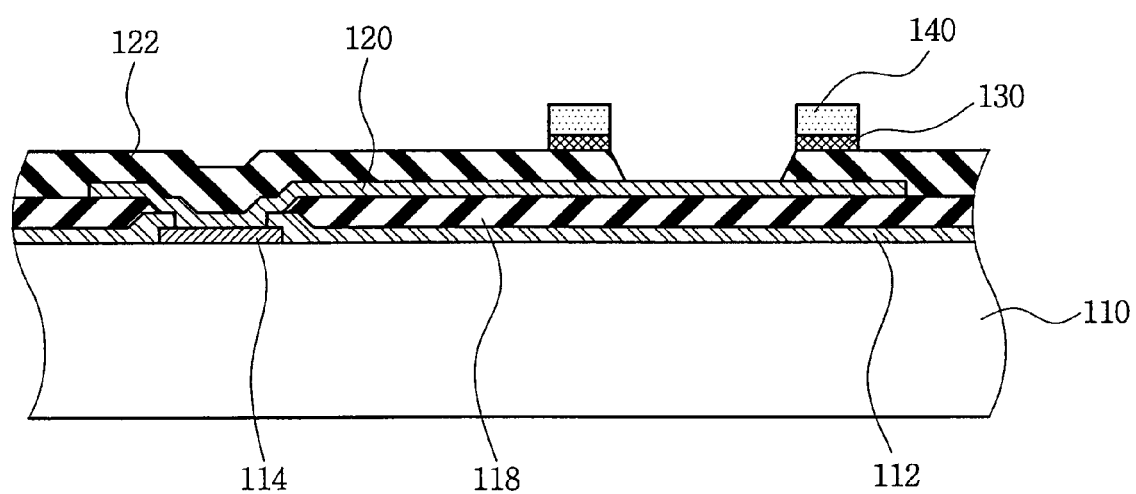

Once ferrite layer 132 is formed, a photoresist layer is formed and patterned using conventional techniques to produce a photoresist pattern 140. Photoresist pattern 140 defines the geometry of the ferrite structure to-be-formed from ferrite layer 132. Referring to FIG. 5C, photoresist pattern 140 is used to selectively remove the bulk of ferrite layer 132 to thereby generate ferrite structure 130.

Figure 5D:
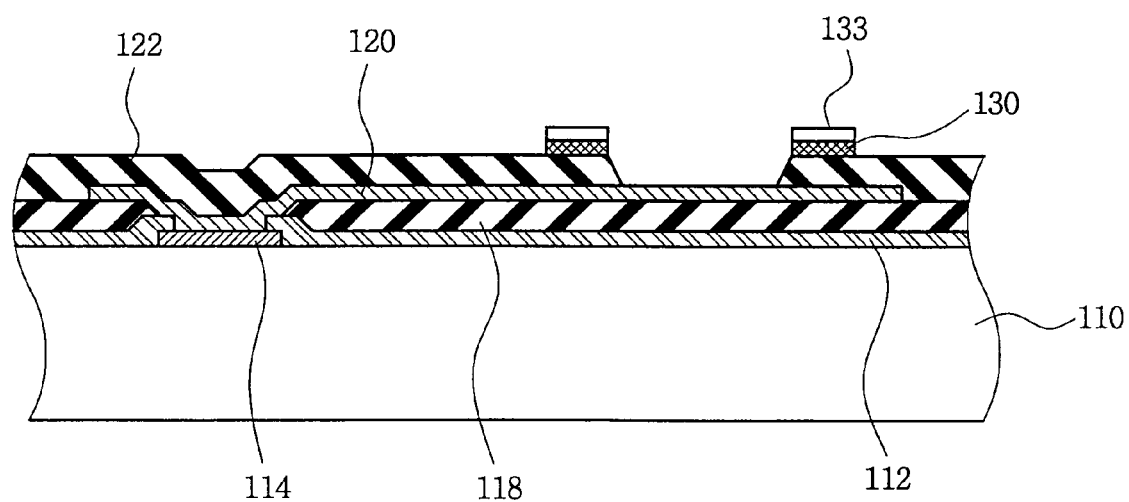

Referring to FIG. 5D, following the formation of ferrite structure 130, photoresist pattern 140 is removed. An adhesion layer 133 may optionally be formed on the upper surface of ferrite structure 130 to improve mechanical adhesion and/or electrical contact with other termination point elements, such as a UBM layer or a ball structure (not shown in FIG. 5D). Adhesion layer 133 may be formed using conventional photolithography and etching processes. In one embodiment, adhesion layer 133 is formed from a material comprising at least one of Ti, Ta, and Cr. Following the formation of adhesion layer 133, when used, an UBM layer and a ball structure may be formed on ferrite structure 130. Thus, where present, adhesion layer 133 is deemed in some embodiments of the invention to comprise part of the ferrite structure 130.

Figure 5E:
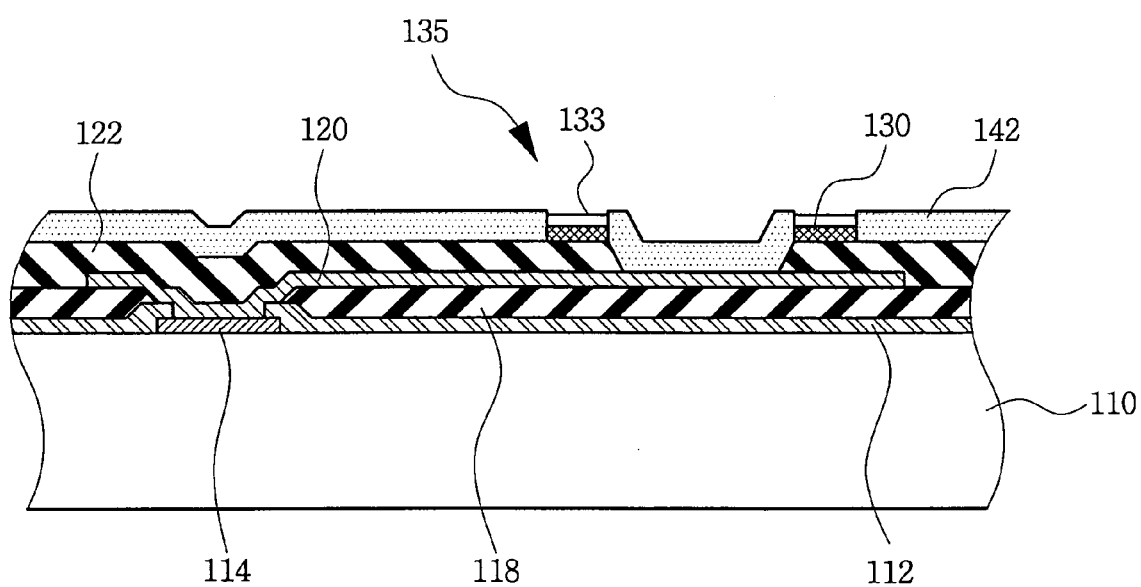

FIG. 5E illustrates another method adapted to the formation of a termination point consistent with embodiment(s) of the invention. Here, all the exemplary steps described above in relation to FIG. 5A are repeated. However, once contact well 117 has been formed, a photoresist 142 pattern is formed to selectively expose one or more ferrite formation regions 135 proximate contact well 117, (e.g., surrounding contact well 117). The one or more ferrite formation regions 135 then receive ferrite material to form ferrite structure 130 during a subsequently performed electro-plating process, for example.

Here again, an adhesion layer 133 may optionally be included as part of ferrite structure 130.

Figure 5F:
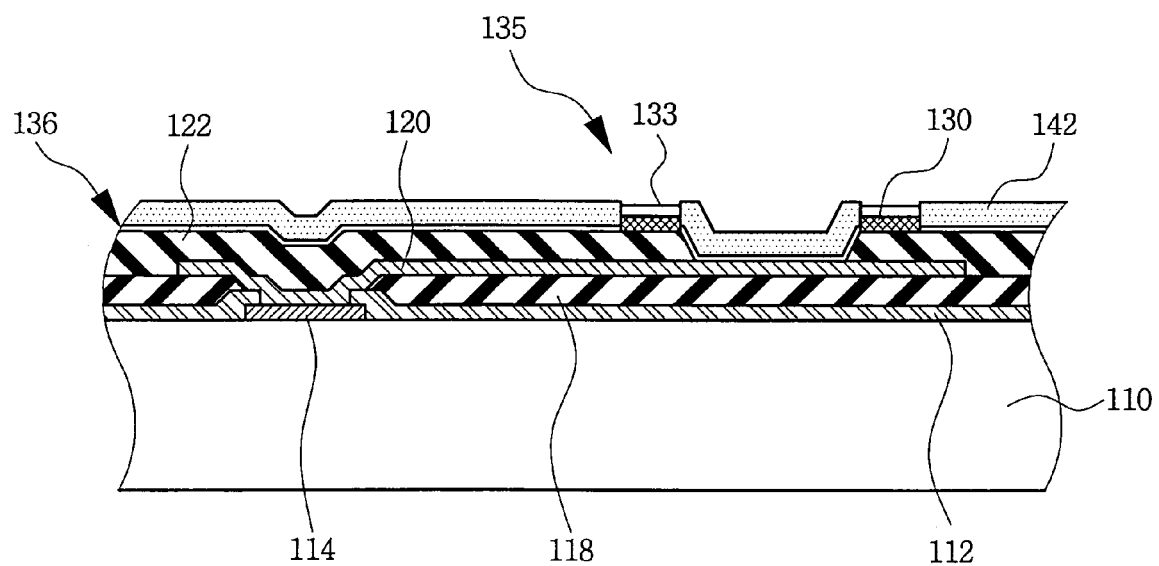

The exemplary method described with reference to FIG. 5E may be facilitated by the formation of a seed layer 136, as illustrated in FIG. 5F. Seed layer 136 may be formed, for example, from a first (lower) seed layer formed from Ti or an alloy containing Ti, and a second (upper) seed layer formed from Cu, Ni, or an alloy containing same, for example. Following formation of seed layer 136 on second insulating layer 122, photoresist layer 142 may be formed and patterned. With seed layer 136 selectively exposed through photoresist pattern 142 in ferrite formation regions 135, the ferrite material ultimately forming ferrite structure 130 may be readily deposited (e.g., electro-plated) on the exposed portions of seed layer 136. Following formation of ferrite structure 130, photoresist pattern 142 and portions of seed layer 136 not incorporated into ferrite structure 130 are removed.

The foregoing exemplary methods may be modified to produce the termination point structure illustrated in FIG. 4, wherein conductive pad 114 is formed directly under (e.g., vertically aligned with) ball structure 126. In such a circumstance, UBM layer 124 may be formed on conductive pad 114 as it is exposed through insulting layer 112 and first insulating layer 118. UBM layer 124 may be formed after the formation of ferrite structure 230 on first insulating layer 118 using a method such as the methods described above in relation to FIGS. 5A through 5F. Thereafter, ball structure 126 is seated on UBM layer 124.

As an alternative to the foregoing exemplary embodiments in which UBM layer 124 is formed on ferrite structure 130 (or 230), ferrite structure 130 (230) may instead be formed on UBM layer 124. That is, following formation of contact well 117 exposing a portion of conductive pad 114 through insulating layer 112 and first insulating layer 118, UBM layer 124 may be formed on first insulating layer 118 in electrical contact with conductive pad 114. Thereafter, using a method such as the methods described above (e.g., the method described with reference to FIGS. 5E and 5F), ferrite structure 130 (230) may be formed on UBM layer 124. In such embodiments the optional use of adhesion layer 133 may be particularly useful. That is, an adhesion layer 133 may be formed between ferrite structure 130 (230) and UBM layer 124, and/or between ferrite structure 130 (230) and ball structure 126.

Figure 6:
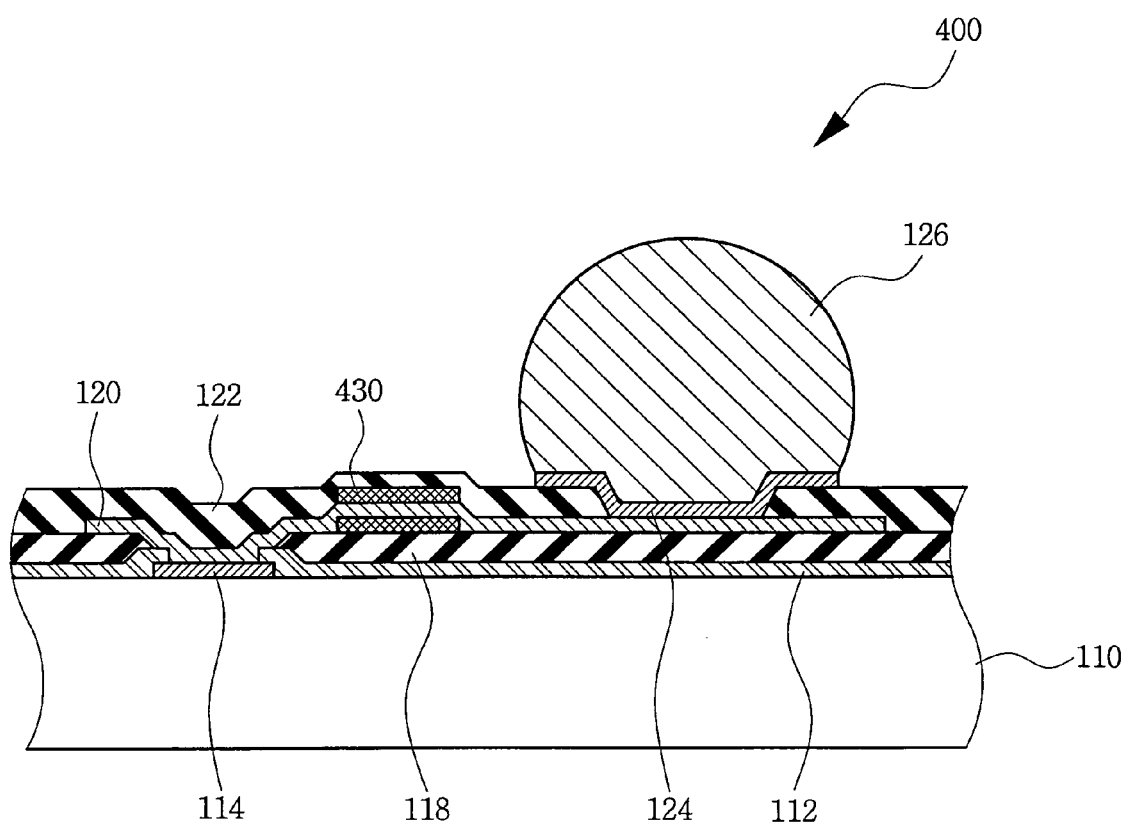
FIGS. 6 and 7 collectively illustrate another device embodiment of the invention comprising a ferrite structure; and, FIGS. 8A through 8E illustrate another method embodiment of the invention.
Figure 7:
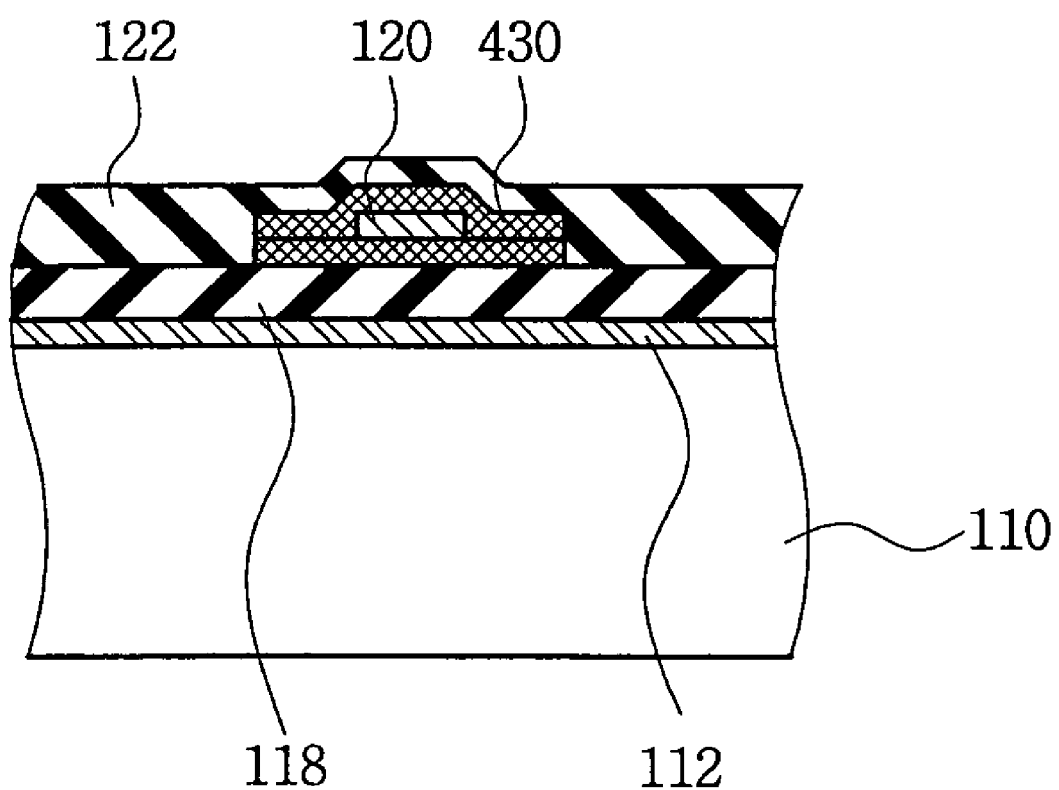

FIGS. 6 and 7 collectively illustrate another embodiment of the invention. However, this exemplary embodiment is drawn to the provision of a ferrite structure associated with a signal line rather than a termination point. In the previously described embodiments, a ferrite structure was formed between the end of a termination point (e.g., ball structure 126) and a conductive pad. The ferrite structure(s) were shown in close proximity to the end of the termination point (e.g., surrounding a lower portion of a ball structure seated within a contact well). Such formations of a ferrite structure amongst the top most layers immediately supporting a connecting ball structure with a conductive pad or signal line is preferred in some embodiments, because such top most layers may be easily reached within the fabrication process, and the sequence of fabrication steps required to form the ferrite structure may accordingly be minimized.

The example illustrated in FIGS. 6 and 7 moves the position of ferrite structure from a region proximate the end of the termination point to a position closer to the conductive pad. In one embodiment, a collar shaped ferrite structure 430 is formed around a redistribution line 120 connecting ball structure 126 and conductive pad 114. This arrangement is illustrated seen in FIG. 6. In this context, the term "collar shaped" refers to the substantially encompassing shape of ferrite structure 430 around redistribution line 120. The actual geometry, and particularly the geometry of the outer portions, of collar shaped ferrite structure 430 may be departed considerably from an elliptical shape. In one embodiment of the invention, collar shaped ferrite structure 430 closely surrounds a signal line of any reasonable cross-sectional shape, but may have any outer geometry (regular or irregular) adapted to bring a sufficient quantity of ferrite material in proximity with the signal. line.

FIG. 7 is a related cross-sectional view further illustrating the shape and disposition of the exemplary ferrite structure 430 as it is formed around redistribution line 120. This combination of redistribution line 120 and ferrite structure 430 may be sandwiched between first insulating layer 118 and second insulating layer 122. The effect of ferrite structure 430 on a signal communicated by a signal line between ball structure 126 and conductive pad 114 is similar to the effect of ferrite structures 130 and 230 previously described, (i.e., it tends to dampen and high frequency signals being communicated by the signal line).

Some embodiments of the invention may benefit from positioning of a ferrite structure away from the seating location of a ball structure. Other embodiments of the invention may benefit from the provision of multiple ferrite structures at intervals along a signal line. Indeed, the exemplary ferrite structures shown in FIG. 2 or 4 might be combined in some embodiments with the exemplary ferrite structure shown in FIGS. 6 and 7.

Figure 8A:
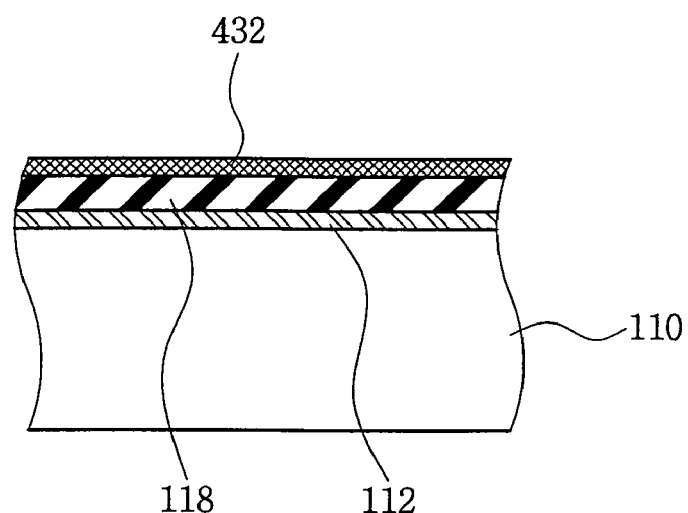

FIGS. 8A through 8E illustrate an exemplary method adapted to form the ferrite structure shown in FIGS. 6 and 7. Referring to FIG. 8A, a first insulting layer 112 is formed on substrate 110, and a second insulating layer 118 is formed on first insulating layer 112. Thereafter, a first ferrite material layer 432 is formed on second insulating layer 118 using, for example, a sputtering process.

Figure 8B:
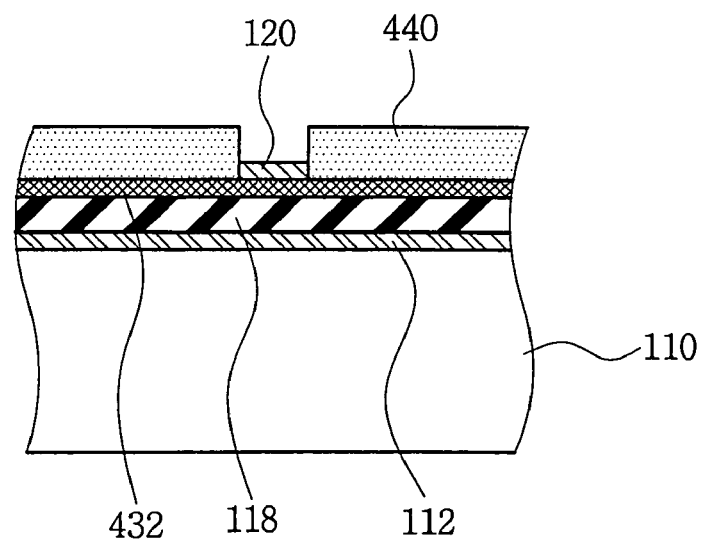

Referring to FIG. 8B, a photoresist layer is then formed and patterned on first ferrite material layer 432 to form first photoresist pattern 440 having a first opening that exposes a first portion of first ferrite material layer 432. The first opening in first photoresist pattern 440 is formed in accordance with the geometry of redistribution line 120. The first width of redistribution line 120 is shown in FIGS. 8B through 8E, but those of ordinary skill in the art will understand that redistribution line 120 will also usually be formed with a defined length across substrate 110. Thereafter, an electro-plating process may be used, for example, to form redistribution line 120 on an exposed portion of first ferrite material layer 432 within first photoresist pattern 440.

Figure 8C:
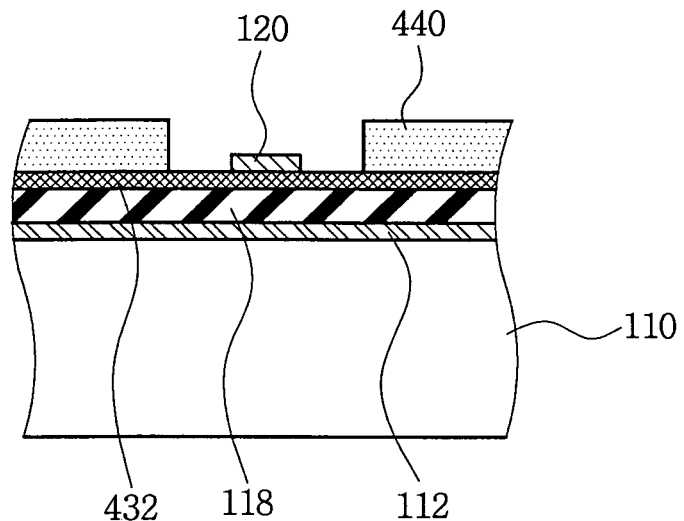

Referring to FIG. 8C, first photoresist pattern 440 may be further patterned to form a second opening exposing a second portion of first ferrite material layer 432 larger (i.e., wider) than the first exposed portion of first ferrite material layer 432. The second opening in first photoresist pattern 440 is defined in relation to the second width of the to-be formed ferrite structure. In the alternative, first photoresist layer 440 may be removed and another photoresist layer formed to define the second opening, but this alternative is deemed equivalent to a re-patterning of first photoresist layer 440.

Figure 8D:
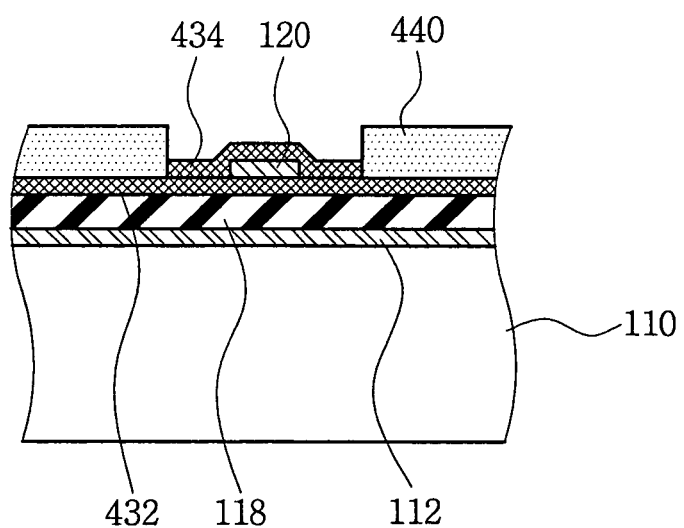

Referring to FIG. 8D, a second ferrite material layer 434 is formed in the second opening to surround redistribution line 120 in conjunction with the exposed second portion of first ferrite material layer 432. In this manner, a collar shaped ferrite structure 430 may be formed around redistribution line 120.

Figure 8E:
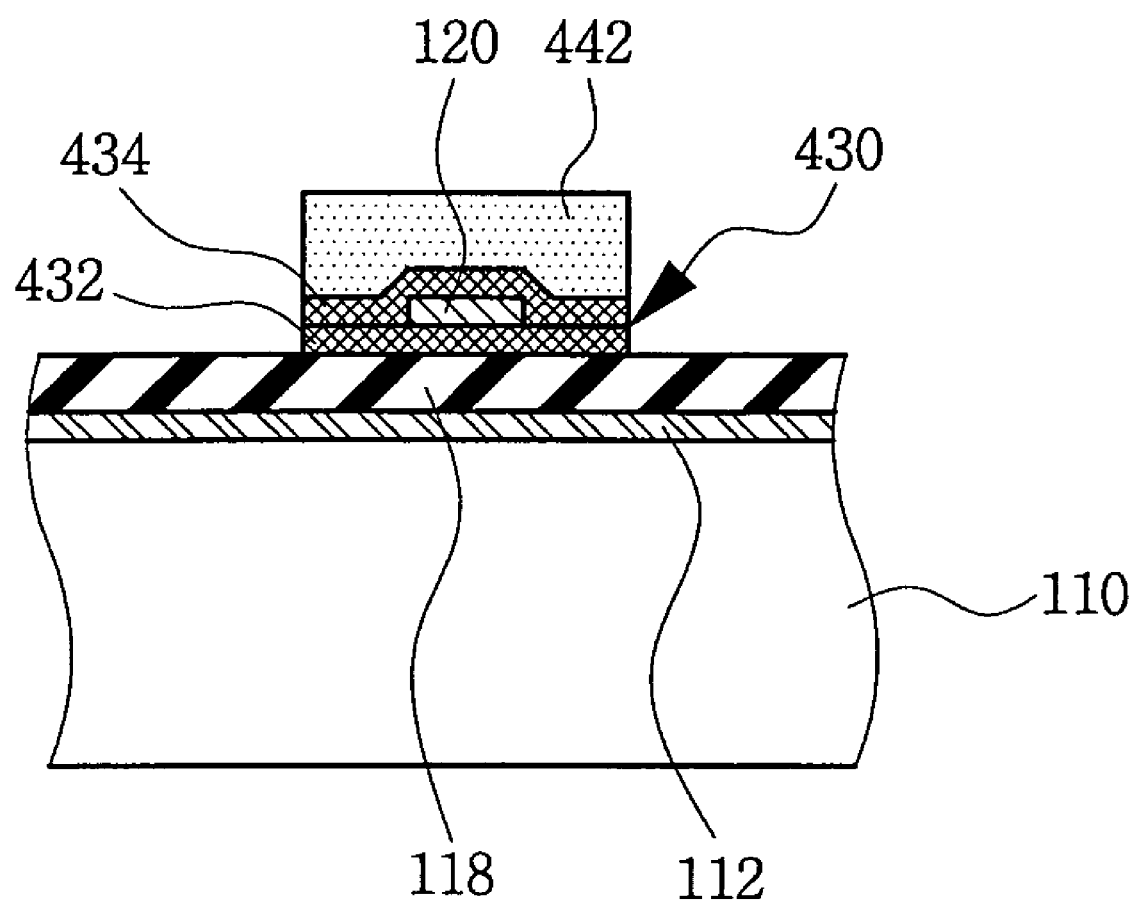

Referring to FIG. 8E, first photoresist pattern 440 is removed, and at least one second photoresist pattern 442 is formed and used to selectively remove the first and second ferrite material layers 432 and 434 to complete ferrite structure 430 having a desired length. Thereafter, as shown in FIGS. 6 and 7, a second insulating layer 122 may be formed on ferrite structure 430. Then, the termination point elements may be formed as needed.

For the sake of clarity, the foregoing examples have been drawn to contemporarily occurring elements and technologies. Commonly available materials have been identified in relation to the making of the invention embodiments. However, the scope of the invention is not limited to the illustrative examples, or the exemplary materials. For example, ball structures have been identified as one type of wafer level termination point, but many other structures may be used to perform similar functions (e.g., connectivity). Certain conventional fabrication processes have been identified which may be adapted by those of ordinary skill in the art to the formation of the material layers and elements described above. However, any reasonable fabrication process may be used to form these layers and elements.

For the sake of clarity, the foregoing description has been drawn to the illustrated examples in the accompanying drawings. Terms such as "horizontal", "vertical", "on", "overlaying", "under", "across", and "though" are used as relative, descriptive terms. These terms should not be ascribed as mandatory or literal construction, but should be read as suggesting possible relationships within the exemplary embodiments. The term "on" has been used to describe relationships in which a layer or element is formed directly on another layer or element, as well as relationships in which intervening layers and/or elements are present.

The actual scope of the invention is defined by the attached claims.

What is claimed is:

1. A semiconductor device, comprising:
   a conductive pad formed on a substrate;
   a termination point electrically connected to the pad and disposed on the substrate, the termination point comprising a bump structure formed on and aligned with the conductive pad;
   a collar shaped discrete ferrite structure formed between the conductive pad and the termination point surrounding a lower portion of the bump structure; and
   an under bump metal UBM layer formed between the ferrite structure and the bump structure.

2. The semiconductor device of claim 1, wherein the bump structure comprises a ball structure formed from a material comprising a metal or a metal alloy.

3. The semiconductor device of claim 1, wherein the ferrite structure comprises an adhesion layer adapted to receive the UBM layer.

4. The semiconductor device of claim 1, wherein the ferrite structure is formed from a material comprising oxidized ferrum, and at least one metal or metal alloy.

5. The semiconductor device of claim 1, wherein the collar shaped ferrite structure comprises an elliptical shaped collar, a rectangular shaped collar, or a polygonal shaped collar.

6. The semiconductor device of claim 1, wherein the conductive pad is formed from a material comprising copper or aluminum, and the UBM layer is formed from a material comprising titanium, tungsten, nickel, tantalum, chromium, or gold;
   wherein the ferrite structure is formed from a material comprising oxidized ferrum and at least one metal or metal alloy, and wherein the ferrite structure comprises an adhesion layer formed between the ferrite structure and the UBM layer.

7. The semiconductor device of claim 1, wherein the UBM layer has an outer diameter seating the bump structure, and the discrete ferrite structure has an outer diameter the same as the outer diameter of the UBM layer.

8. A semiconductor device, comprising:
   a conductive pad formed on a substrate;
   a termination point electrically connected to the pad via a signal line; and
   a collar shaped ferrite structure surrounding the signal line between the conductive pad and the termination point.

9. The semiconductor device of claim 8, wherein the signal line is a redistribution line.

10. A semiconductor device, comprising:
    a conductive pad formed on a substrate;
    an under bump metal (UBM) layer having an outer diameter and formed on the substrate;
    a bump structure seated on the UBM layer;
    a collar shaped ferrite structure disposed between the conductive pad and the bump structure and formed under the UBM layer to surround a lower portion of the bump structure, wherein the ferrite structure has an outer diameter the same as the outer diameter of the UBM layer.

11. The semiconductor device of claim 10, further comprising:
    a signal line electrically connecting the conductive pad and the bump structure.

12. The semiconductor device of claim 11, wherein the bump structure is formed from a material comprising a metal or a metal alloy.

13. The semiconductor device of claim 11, wherein the signal line comprises a redistribution line.

14. The semiconductor device of claim 10, wherein the ferrite structure comprises an adhesion layer adapted to receive the UBM layer.

15. The semiconductor device of claim 10, wherein the ferrite structure is formed from a material comprising oxidized ferrum, and at least one metal or metal alloy.

16. The semiconductor device of claim 10, wherein the ferrite structure has an elliptical collar shape, a rectangular collar shape, or a polygonal collar shape.

17. The semiconductor device of claim 10, wherein the conductive pad is formed from a material comprising copper or aluminum, and the UBM layer is formed from a material comprising titanium, tungsten, nickel, tantalum, chromium, or gold;
    wherein the ferrite structure is formed from a material comprising oxidized ferrum and at least one metal or metal alloy, and wherein the ferrite structure comprises an adhesion layer formed between the ferrite structure and the UBM layer.

* * * * *